United States Patent
Chao

(10) Patent No.: US 8,268,086 B2
(45) Date of Patent: Sep. 18, 2012

(54) METHOD FOR PROCESSING A PHOTOMASK FOR SEMICONDUCTOR DEVICES

(75) Inventor: Chu Chu Chao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 706 days.

(21) Appl. No.: 10/927,821

(22) Filed: Aug. 27, 2004

(65) Prior Publication Data

US 2005/0274397 A1 Dec. 15, 2005

(30) Foreign Application Priority Data

Jun. 10, 2004 (CN) ............... 2004 1 0025326

(51) Int. Cl.
B08B 3/04 (2006.01)
(52) U.S. Cl. .............. 134/33; 134/1; 134/1.3; 134/25.4; 134/26; 134/902
(58) Field of Classification Search .............. 134/1, 1.3, 134/25.4, 26, 33, 902
See application file for complete search history.

(56) References Cited

U.S. PATENT DOCUMENTS

| | | | | |
|---|---|---|---|---|
| 4,086,870 A | * | 5/1978 | Canavello et al. | 118/52 |
| 4,132,550 A | * | 1/1979 | Bowman | 430/313 |
| 4,519,846 A | * | 5/1985 | Aigo | 134/15 |
| 5,376,483 A | * | 12/1994 | Rolfson | 430/5 |
| 6,039,059 A | * | 3/2000 | Bran | 134/105 |
| 6,290,865 B1 | * | 9/2001 | Lloyd et al. | 216/92 |
| 6,394,104 B1 | * | 5/2002 | Chen et al. | 134/1.1 |
| 6,403,431 B1 | * | 6/2002 | Chung et al. | 438/296 |
| 6,669,808 B2 | * | 12/2003 | Adachi et al. | 156/345.11 |
| 7,077,915 B2 | * | 7/2006 | Nagamura et al. | 134/29 |
| 2002/0006674 A1 | * | 1/2002 | Ma et al. | 438/3 |
| 2002/0139401 A1 | * | 10/2002 | Reynolds | 134/95.3 |
| 2002/0155360 A1 | * | 10/2002 | Tange et al. | 430/5 |
| 2003/0084918 A1 | * | 5/2003 | Kim | 134/1.2 |
| 2003/0116176 A1 | * | 6/2003 | Rothman et al. | 134/1.3 |

FOREIGN PATENT DOCUMENTS

CN 1402311 A 12/2003

* cited by examiner

Primary Examiner — Bibi Carrillo
(74) Attorney, Agent, or Firm — Kilpatrick Townsend and Stockton LLP

(57) ABSTRACT

A method for processing a photomask for semiconductor devices. The method includes providing a partially completed mask structure, which has a backside and a face. The face includes a substrate material, a light blocking layer overlying the substrate material, and an overlying patterned photoresist layer overlying the light blocking layer. The method includes supporting the backside of the mask structure to maintain the mask structure in place and maintaining the face of the patterned photoresist layer in a direction parallel to a gravitational force and toward the gravitational force. The method includes rotating the mask structure in an annular manner as the patterned photoresist layer of the mask structure is being maintained in the direction parallel to the gravitational force and toward the gravitational force. Additionally, the method includes applying cleaning fluid on the patterned photoresist layer as the patterned photoresist layer of the mask structure is being maintained in the direction parallel to gravity, is facing the gravitational force, and is being rotated to remove one or more particles from the patterned surface. Preferably, the method includes accelerating the one or more particles away from the surface of the patterned photoresist layer, whereupon the one or more particles are prevented from attaching themselves back to the patterned photoresist layer via the gravitational force.

13 Claims, 2 Drawing Sheets plate pattern face down rinse method

METHOD FOR PROCESSING A PHOTOMASK FOR SEMICONDUCTOR DEVICES

CROSS-REFERENCES TO RELATED APPLICATIONS

This application claims benefit to Chinese Patent Application No. 200410025326.6, filed on Jun. 10, 2004, and is incorporated herein by this reference.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits and their processing for the manufacture of semiconductor devices. More particularly, the invention provides a method and structures for cleaning mask structures used for patterning semiconductor integrated circuits. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of reticle mask structures commonly used for optical lithography of photoresist patterns for semiconductor integrated circuits. Although there have been significant improvements, such designs still have many limitations. As merely an example, these designs must become smaller and smaller but still require precise shapes and sizes for the efficient transfer of predetermined patterns. Precise shapes and sizes are required since such mask structures are used as a master pattern for patterning semiconductor devices. Certain mask structures have been prone to detects, which render the masks useless. If such defects are used for manufacturing semiconductor devices, resulting integrated circuits would be prone to failure and possibly long term reliability problems. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for cleaning mask structures used for patterning semiconductor integrated circuits. But it would be recognized that the invention has a much broader range of applicability.

In a specific embodiment, the invention provides a method for processing a photomask for semiconductor devices. The method includes providing a partially completed mask structure, which has a backside and a face. The face includes a substrate material, a light blocking layer overlying the substrate material, and an overlying patterned photoresist layer overlying the light blocking layer. The method includes supporting the backside of the mask structure to maintain the mask structure in place and maintaining the face of the patterned photoresist layer in a direction parallel to a gravitational force and toward the gravitational force. The method includes rotating the mask structure in an annular manner as the patterned photoresist layer of the mask structure is being maintained in the direction parallel to the gravitational force and toward the gravitational force. Additionally, the method includes applying cleaning fluid on the patterned photoresist layer as the patterned photoresist layer of the mask structure is being maintained in the direction parallel to gravity, is facing the gravitational force, and is being rotated to remove one or more particles from the patterned surface. Preferably, the method includes accelerating the one or more particles away from the surface of the patterned photoresist layer, whereupon the one or more particles are prevented from attaching themselves back to the patterned photoresist layer via the gravitational force.

In an alternative specific embodiment, the invention provides an alternative method for processing a photomask for semiconductor devices. The method includes providing a partially completed mask structure, which has a substrate material having a backside and a face. The face includes a light blocking layer (e.g., chrome, antireflective coating) overlying the substrate material, and an overlying patterned photoresist layer overlying the light blocking layer. The method includes supporting the backside of the mask structure to maintain the mask structure in place and maintaining the face of the patterned photoresist layer in a direction parallel to a gravitational force and toward the gravitational force. Additionally, the method includes rotating the mask structure in an annular manner as the patterned photoresist layer of the mask structure is being maintained in the direction parallel to the gravitational force and toward the gravitational force. The method includes applying cleaning fluid on the patterned photoresist layer as the patterned photoresist layer of the mask structure is being maintained in the direction parallel to gravity, is facing the gravitational force, and is being rotated to remove one or more particles from the patterned surface using the cleaning fluid. The patterned photoresist layer is dried. The patterned photoresist layer is now free from the one or more particles. The method also includes performing an etching process on the exposed surfaces of the light blocking layer using the patterned photoresist layer as a mask.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for smaller design rules. The invention also provides resulting masks used for photolithography that are substantially free from defects. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for cleaning mask structures used for patterning semiconductor integrated circuits. But it would be recognized that the invention has a much broader range of applicability.

Figure 1:
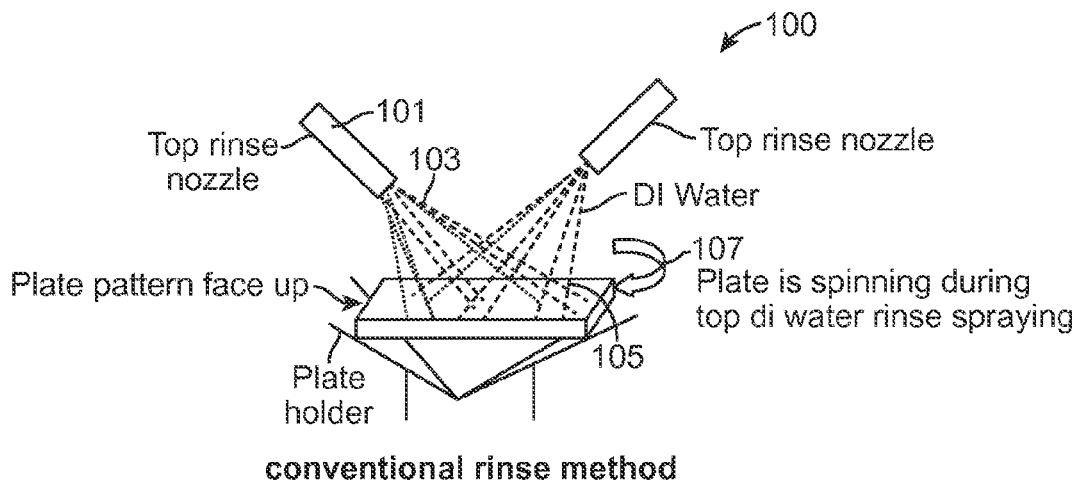
FIG. 1 is a simplified side-view diagram illustrating a conventional method.
Figure 2:
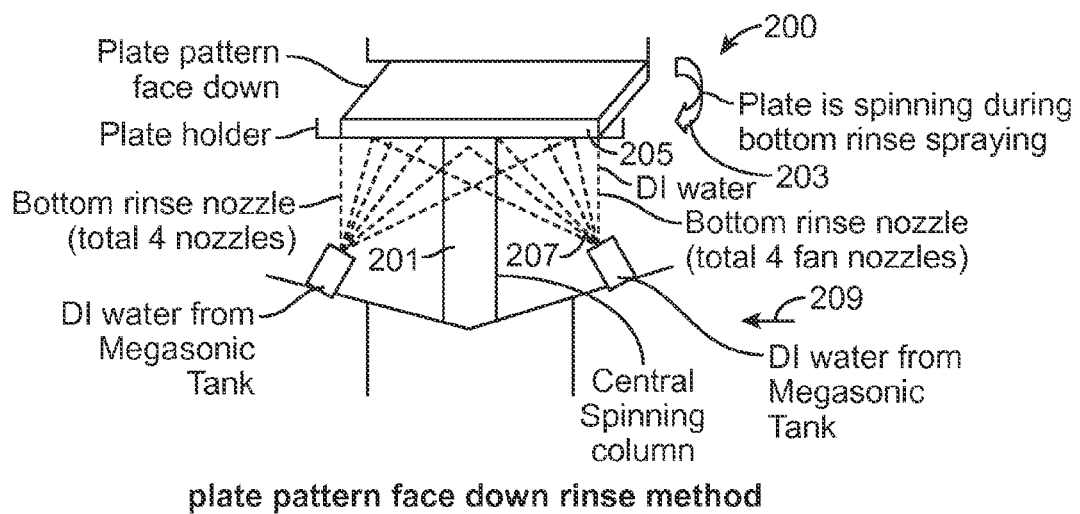
FIGS. 2 through 5 illustrate a method for processing a photomask structure according to an embodiment of the present invention.

FIG. 1 is a simplified side-view diagram illustrating a conventional method. As shown, the method is performed using system 100. The system includes a plate holder, which holds a reticle structure. The reticle structure is subjected to cleaning fluid 103. Such cleaning fluid is outputted through nozzles 101. As shown, the plate holder is rotated 107. Limitations exist with the conventional method and system. For examples, reticles are prone to damage, which cause reliability issues. These and other limitations are described throughout the present specification and more particularly below.

A cleaning method according to an embodiment of the present invention may be outlined as follows:
1. Provide a partially completed mask structure, which has a substrate material having a backside and a face, which has a light blocking layer (e.g., chrome, antireflective coating) overlying the substrate material, and an overlying patterned photoresist layer overlying the light blocking layer;
2. Support the backside of the mask structure to maintain the mask structure in place and maintaining the face of the patterned photoresist layer in a direction parallel to a gravitational force and toward the gravitational force;
3. Rotate the mask structure in an annular manner as the patterned photoresist layer of the mask structure is being maintained in the direction parallel to the gravitational force and toward the gravitational force;
4. Apply cleaning fluid on the patterned photoresist layer as the patterned photoresist layer of the mask structure is being maintained in the direction parallel to gravity, is facing the gravitational force, and is being rotated to remove one or more particles from the patterned surface using the cleaning fluid;
5. Dry the patterned photoresist layer, which is now free from the one or more particles;
6. Perform an etching process on the exposed surfaces of the light blocking layer using the patterned photoresist layer as a mask; and
7. Perform other steps, as desired.

The above sequence of steps provides a method according to an embodiment of the present invention. As shown, the method uses a combination of steps including a way of processing a patterned photoresist structure for a reticle. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 5 illustrate a method for processing a photomask structure according to an embodiment of the present invention. These diagrams are merely examples, which should not unduly limit the scope of the claims herein. One of ordinary skill in the art would recognize many variations, alternatives, and modifications. As shown, the method begins by providing system 200. The system includes a plate holder 205, which holds a reticle structure. The reticle structure is subjected to cleaning fluid 207. Such cleaning fluid is outputted through nozzles that are spatially disposed to cover selected surface regions of the reticle structure. The plate holder is rotated 203. Preferably, the rotation occurs using pedestal structure 201. Preferably, the reticle structure has a face that is toward the direction of gravity, which is down in this embodiment.

Figure 5:
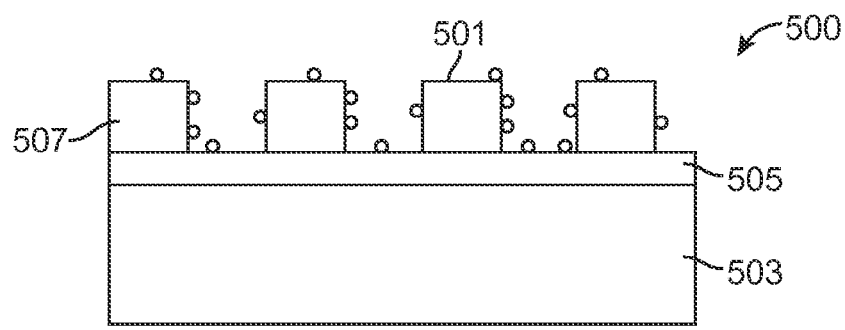

Preferably, the method includes providing a partially completed mask structure 500, which has a substrate material having a backside and a face, as illustrated by FIG. 5. The face includes a light blocking layer (e.g., chrome, antireflective coating) 505 overlying the substrate material 503, and an overlying patterned photoresist layer 507 overlying the light blocking layer. The method includes supporting the backside of the mask structure to maintain the mask structure in place and maintaining the face of the patterned photoresist layer in a direction parallel to a gravitational force and toward the gravitational force. Additionally, the method includes rotating the mask structure in an annular manner as the patterned photoresist layer of the mask structure is being maintained in the direction parallel to the gravitational force and toward the gravitational force. The method includes applying cleaning fluid on the patterned photoresist layer as the patterned photoresist layer of the mask structure is being maintained in the direction parallel to gravity, is facing the gravitational force, and is being rotated to remove one or more particles 501 from the patterned surface using the cleaning fluid. The patterned photoresist layer is dried. The patterned photoresist layer is now free from the one or more particles. The method also includes performing an etching process on the exposed surfaces of the light blocking layer using the patterned photoresist layer as a mask.

Optionally, the cleaning fluid can be subjected to sonic power 209. That is, the cleaning fluid can be deionized water that is subjected to megasonic energy. The megasonic energy transfers into the cleaning fluid that impacts surface regions of the partially completed mask structure or reticle structure. Depending upon the embodiment, there can be other variations, alternatives, and modifications.

Figure 3:
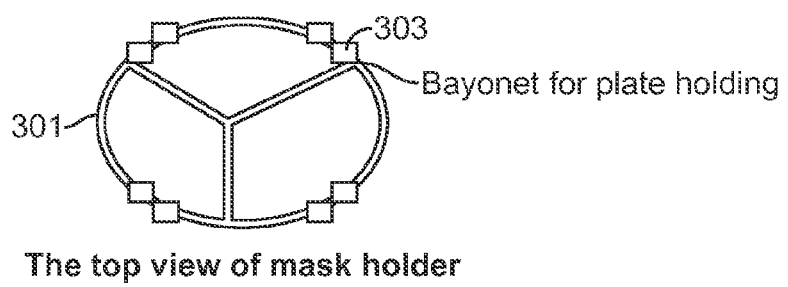
Figure 4:
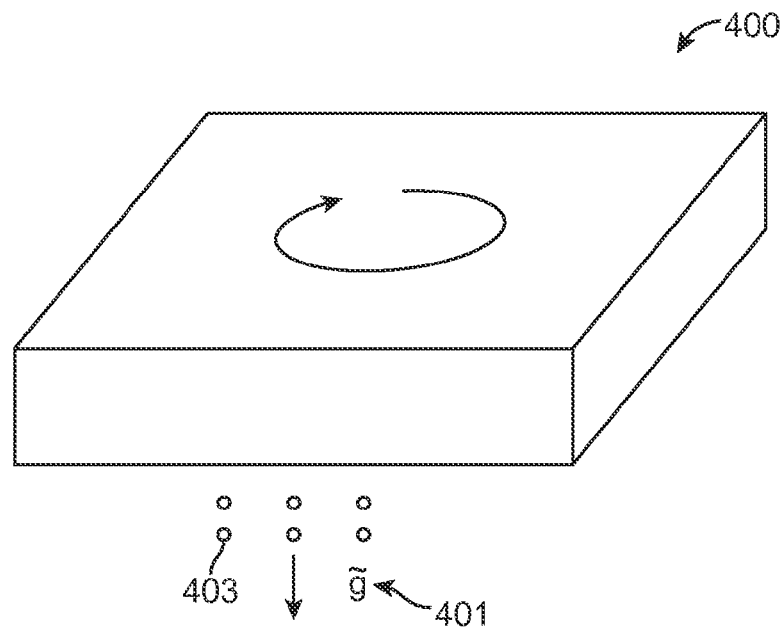

Referring to FIG. 3, the reticle is maintained on the plate holder using a plurality of fastening devices. Here, the fastening devices are bayonett style, which claims onto edges of the reticle structures. Other types of devices such as vacuum and the like can also be used depending upon the application.

Depending upon the embodiment, the method can also include other features. That is, the cleaning fluid comprises deionized water, which is preferably free from particles greater than 0.1 micron. Such cleaning fluid is maintained in a chamber, which houses the system above or other like systems. The plate holder can be rotated at speeds of less than fifty revolutions per minute in certain embodiments. Such rotation can enhance removal of particles 403 ranging from about 1 to 2 microns. The particles are accelerated via gravity 401 and do not reattach themselves to the mask structure, as illustrated by reference numeral 400 in FIG. 4. Here, the patterned photoresist layer is characterized by a design rule of 0.7 micron and less, but can also be at other dimensions. Preferably, the method occurs at a temperature of about room temperature such that the photoresist material is not damaged. Depending upon the embodiment, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing a photomask reticle structure for semiconductor devices, the method comprising the steps of:
   providing a partially completed reticle mask structure, the reticle mask structure including a backside and a face, the face including a substrate material, a light blocking layer overlying the substrate material, and an overlying patterned photoresist layer overlying the light blocking layer;
   supporting the backside of the reticle mask structure to maintain the reticle mask structure in place;
   maintaining the face of the patterned photoresist layer in a direction downwardly toward a gravitational force;
   rotating the reticle mask structure in an annular manner at a rotation speed of less than about fifty revolutions per minute as the patterned photoresist layer of the reticle mask structure is being maintained in the direction downwardly toward the gravitational force;
   applying a cleaning fluid selectively to an edge region of the patterned photoresist layer as the patterned photoresist layer of the reticle mask structure is being maintained in the downward direction facing the gravitational force, and is being rotated to remove one or more particles from the patterned photoresist layer, wherein the supporting, maintaining, rotating, and applying steps are provided in a single chamber;
   accelerating the one or more particles away from the patterned photoresist layer via gravity, the one or more particles being prevented from attaching themselves back to the patterned photoresist layer via the gravitational force;
   turning off the cleaning fluid to dry the patterned photoresist layer while maintaining the downward direction of the patterned photoresist layer of the reticle mask structure; and
   performing an etching process on exposed surfaces of the light blocking layer using the patterned photoresist layer as a mask, wherein the etching process is performed after the step of turning off the cleaning fluid.

2. The method of claim 1 wherein the cleaning fluid comprises deionized water, the deionized water being free from particles greater than 0.1 micron.

3. The method of claim 1 wherein the cleaning fluid is outputted through a nozzle, the nozzle being coupled to a megasonic source.

4. The method of claim 1 wherein the patterned photoresist layer has particles ranging from about 1 to 2 microns.

5. The method of claim 1 wherein the patterned photoresist layer is characterized by a design rule of 0.7 micron and less.

6. The method of claim 1 wherein the cleaning fluid is maintained at a temperature of about room temperature.

7. A method for processing a photomask reticle structure for semiconductor devices, the method comprising the steps of:
   providing a partially completed reticle mask structure, the reticle mask structure including a substrate material having a backside and a face, the face including a light blocking layer overlying the substrate material, and an overlying patterned photoresist layer overlying the light blocking layer;
   supporting the backside of the reticle mask structure to maintain the reticle mask structure in place;
   maintaining the face of the patterned photoresist layer in a direction toward a gravitational force;
   rotating the reticle mask structure in an annular manner at a rotation speed of less than about fifty revolutions per minute as the patterned photoresist layer of the reticle mask structure is being maintained in the direction toward the gravitational force;
   applying a cleaning fluid on the patterned photoresist layer as the patterned photoresist layer of the reticle mask structure is facing the gravitational force, and is being rotated to remove one or more particles from the patterned photoresist layer using the cleaning fluid, wherein the removed one or more particles are accelerated away from the patterned photoresist layer via gravity, wherein the supporting, maintaining, rotating, and applying steps are provided in a single chamber, the chamber being partially sealed;
   drying the patterned photoresist layer by turning off the cleaning fluid, the patterned photoresist layer being free from the one or more particles; and
   performing an etching process on exposed surfaces of the light blocking layer using the patterned photoresist layer as a mask, wherein the etching process is performed after the drying step.

8. The method of claim 7 wherein the cleaning fluid comprises deionized water, the deionized water being free from particles greater than 0.1 micron.

9. The method of claim 7 wherein the cleaning fluid is outputted through a nozzle, the nozzle being coupled to a megasonic source.

10. The method of claim 7 wherein the cleaning fluid is selectively applied to an edge region of the patterned photoresist layer.

11. The method of claim 7 wherein the patterned photoresist layer has particles ranging from about 1 to 2 microns.

12. The method of claim 7 wherein the patterned photoresist layer is characterized by a design rule of 0.7 micron and less.

13. The method of claim 7 wherein the cleaning fluid is maintained at a temperature of about room temperature.

* * * * *